United States Patent [19]
Chiang et al.

[11] Patent Number: 5,695,109
[45] Date of Patent: Dec. 9, 1997

[54] SOLDER PASTE INTER-LAYER ALIGNMENT APPARATUS FOR AREA-ARRAY ON-BOARD REWORK

[75] Inventors: Ping-Huang Chiang, Hsinchu; Lung-Tai Chen, Chutung Hisnchu; Yu-Kon Chou, Taipei, all of Taiwan

[73] Assignee: Industrial Technology Research Institute, Taiwan

[21] Appl. No.: 562,007

[22] Filed: Nov. 22, 1995

[51] Int. Cl.$^6$ .................................................. B23K 35/14
[52] U.S. Cl. .......................... 228/33; 228/56.3; 101/127
[58] Field of Search ........................ 228/33, 56.3, 248.1, 228/180.22; 101/127; 118/213, 504; 29/832, 840

[56] References Cited

U.S. PATENT DOCUMENTS

| | | | |
|---|---|---|---|
| 4,354,629 | 10/1982 | Grassauer et al. | 228/56.3 |
| 4,842,184 | 6/1989 | Miller, Jr. | 228/56.3 |
| 5,040,717 | 8/1991 | McGaffigan | 228/248.1 |
| 5,323,947 | 6/1994 | Juskey et al. | 228/56.3 |
| 5,324,569 | 6/1994 | Nagesh et al. | 228/56.3 |
| 5,439,164 | 8/1995 | Hasegawa et al. | 228/248.1 |
| 5,456,004 | 10/1995 | Swamy | 228/56.3 |

OTHER PUBLICATIONS

Research Disclosure, "Multilayer Construction Technique for PCB", Kenneth Mason Publications Ltd, England, 33406, Feb. 1992, No. 334.

*Primary Examiner*—Samuel M. Heinrich
*Attorney, Agent, or Firm*—Finnegan, Henderson, Farabow, Garrett & Dunner, L.L.P.

[57] ABSTRACT

An integrated circuit (IC) package includes solder paste inter-layer and alignment apparatus 100 for applying and aligning solder paste 150 with corresponding solder pads 160 on the IC package carrier 200. The apparatus 100 includes a thin layer 100 which is composed of high-temperature-resistant, non-solder-wetting, and electrical-insulating materials. The apparatus further has a plurality of apertures 110, each disposed on and penetrating through the thin layer 100 for applying solder paste 150 therein and for aligning with the corresponding solder pads 160 on the IC package carrier 200. The apparatus 100 further includes a removable thin film tape 120 disposed on a bottom surface of the thin layer 100 for temporarily maintaining the solder paste 150 in the plurality of apertures 110.

7 Claims, 5 Drawing Sheets

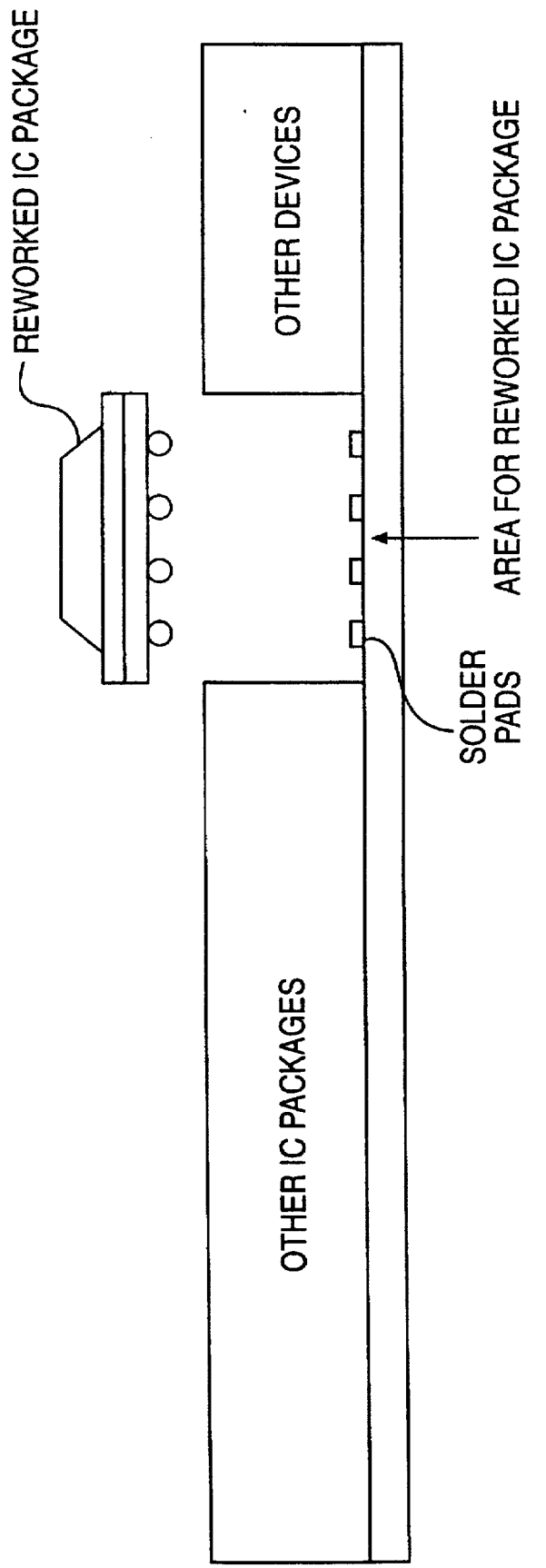

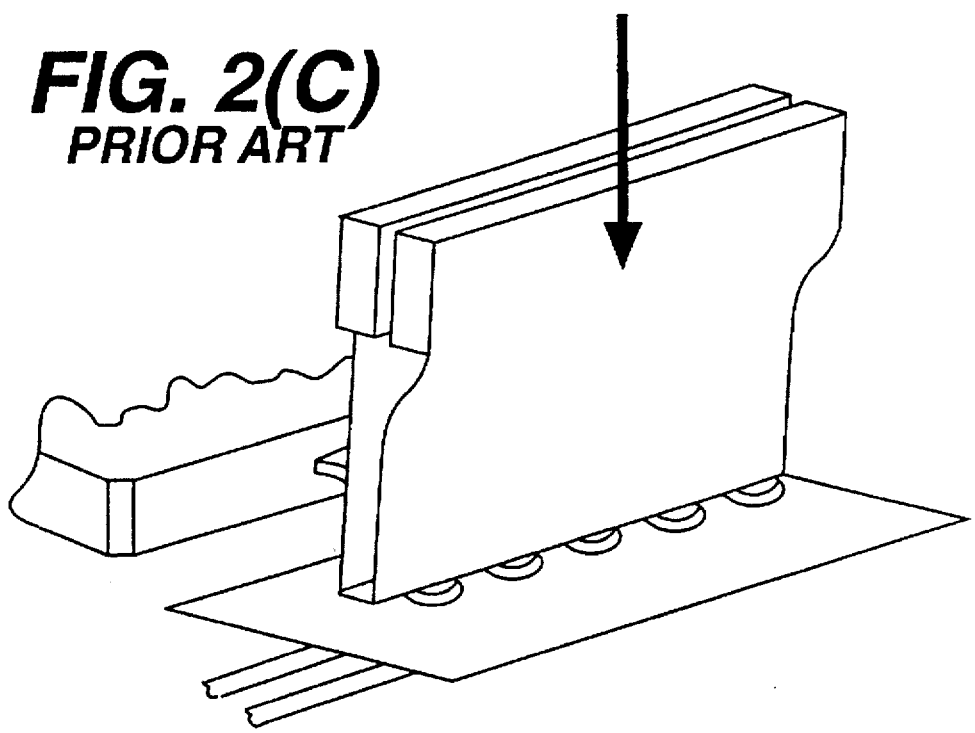
FIG. 2(C) *PRIOR ART*
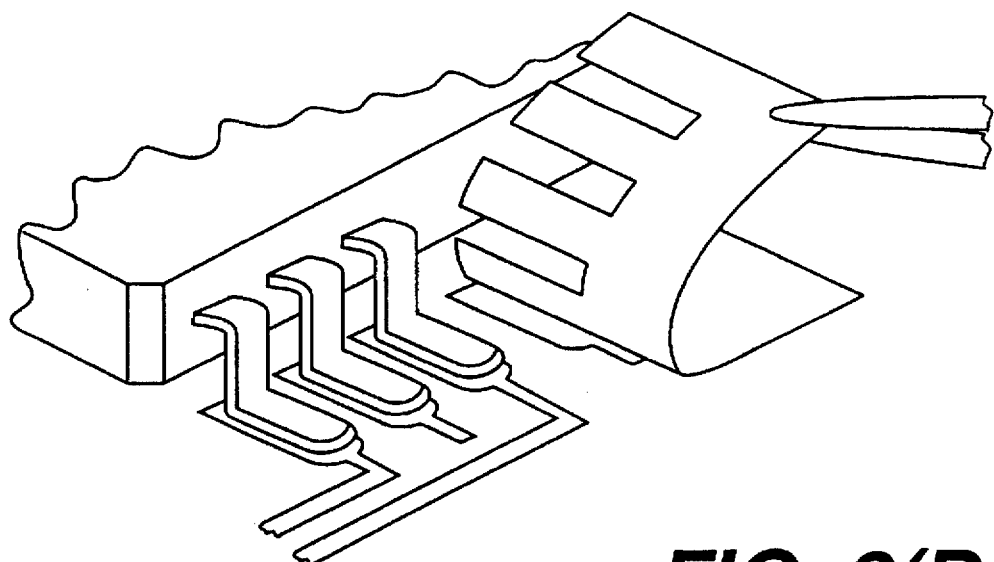
FIG. 2(D) *PRIOR ART*

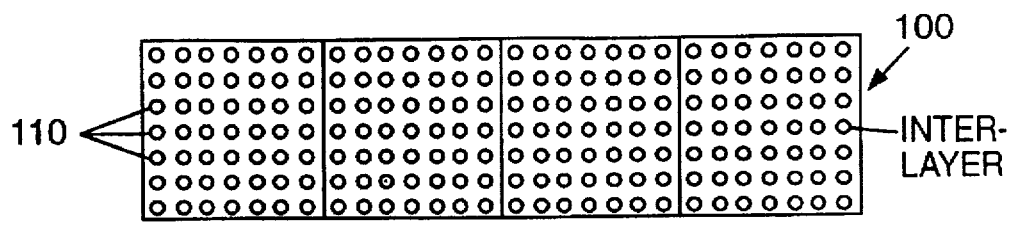
FIG. 3
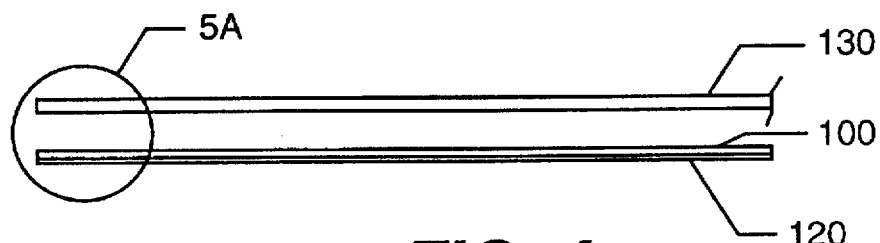
FIG. 4
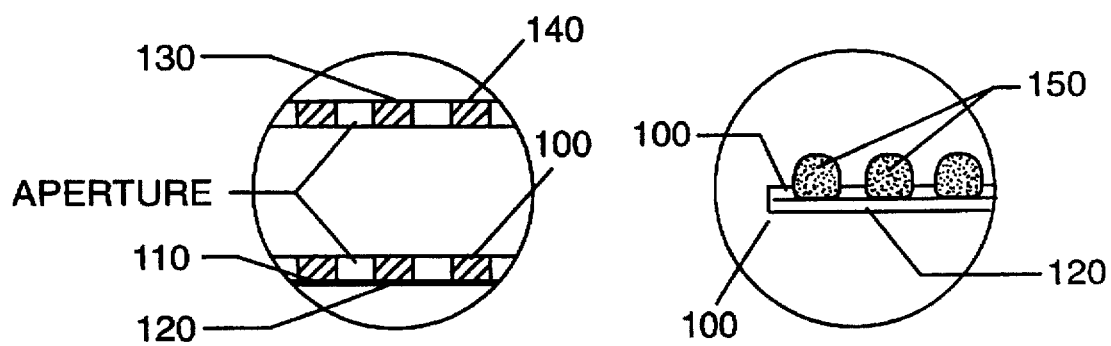
FIG. 5A  FIG. 5B ic,109

SOLDER PASTE INTER-LAYER ALIGNMENT APPARATUS FOR AREA-ARRAY ON-BOARD REWORK

BACKGROUND OF THE INVENTION

1. Field of the Invention

This invention relates generally to the manufacturing and packaging of semiconductor devices. More particularly, this invention relates to an improved apparatus for repair and rework of IC packages for attaching solder balls to solder pads on a substrate and to a package carrier, e.g., a printed circuit board (PCB), for fabrication and packaging of the semiconductor devices.

2. Description of the Prior Art

The complexity, processing difficulties and inflexibility in managing rework for an area array package, e.g., a ball grid array (BGA) or a column grid array package, for an integrated circuit (IC) have become important technical issues now as the BGA package is gaining popularity in the IC industry and is expected to multiply over the next few years. The BGA technology is preferred because of its many benefits including small package size, good yield, better electrical performance and lower profiles. The details of BGA configuration and the manufacturing processes of making the BGA packaged ICs, are well known among those of ordinary skill in the art and the information is readily available in articles such as: "IBM Details its Ball Grid Array Push", Electronic Engineering Times, Aug. 9, 1993, "Ball Grid Arrays: the Hot New Package" Electronic Engineering Times, Mar. 15, 1993, and may other published articles and patents on the related subjects.

During the BGA assembly process, manufacture defects may occur for connections between solder balls formed on the ball grid array carrier and solder on the circuit board for mounting the BGA package. When a lack of integrity between solder interconnections exists, the entire BAG package, which includes the carrier and the IC die, i.e., art device mounted thereon, is generally removed from the carrier using hot air for localized reflow and then thrown away. As semiconductor devices are becoming more expensive, a preferred choice now is to perform a rework process to repair defective ball grid connections thus allowing the reuse of IC device. Cost savings can be achieved by using a reworked package with a high priced IC device when the defects are caused between the connections of the solder balls to the solder pads on the circuit board.

Under the circumstances that a rework has to be performed on an IC package with defective connections, the stencil which was used to apply the solder paste on the solder pads for making the original package is no longer useful for several reasons. The stencil often is used to cover several IC pad areas while the connection defects may often occur in only one or few ICs. The stencil would therefore be too large for rework unless all the good neighboring ICs are removed which is of course not practical. Even when small stencils are made available, the alignment of the stencil to the solder pads is difficult to perform because the pads are now of different heights when the old solder balls which were attached thereon must be removed. The remaining solder and solder paste residuals often cause the solder pads to be of irregular sizes and shapes even after cleaning. The rework of an IC package is therefore limited by these difficulties that solder balls cannot be conveniently aligned and then soldered to the reworked solder pads. The most primitive and labor intensive method of IC package rework is to form solder paste on each solder pad by hand and then place the solder balls thereon either by hand or by other means before a soldering process is performed to permanently attach the solder balls to the solder pads. This process is time consuming, unreliable, and too costly for large scale operation.

In U.S. Pat. No. 5,392,980, entitled 'Method and Apparatus for Reworking Ball Grid Array Packages to Allow Reuse of Functional Devices' (issued Feb. 28, 1995), Swamy et al. disclose a rework process for ball grid array (BGA) packages which allows for reuse of devices that have been removed for lack of integrity of solder interconnections. The process uses a rework tool which includes a plate including one or more depressions corresponding to the contours of inverted BGA packages. A BGA package for rework is placed in a respective depression with what remains of the original solder ball grid facing upward. The residual solder balls are wicked away leaving the BGA package with the pads exposed where the solder balls were attached prior to removal. A stencil with BGA pattern punched into it is then placed over the rework tool and solder paste is screened onto the rework tool so that the solder is deposited onto the BGA pads via the openings in the stencil. The entire fixture is then subjected to a reflow process to cause the solder to ball up, i.e., attaching securely to the solder pads, during the process. After the reflow process is completed, the stencil is removed leaving behind a ball grid array similar to that found in the original package.

The use of stencil as disclosed by Swamy et al. presents many difficulties. Swamy et al. disclose a rework process for ball grid array (BGA) packages which allows for reuse of devices. However, after the solder balls are attached to the reused IC devices, the IC devices with the BGA solder balls attached are yet to be precisely placed and securely attached to an IC package carrier, e.g., a printer circuit board (PCB). The technique and apparatus disclosed by Swamy et al. cannot resolve the difficulties in re-soldering the IC package onto the PC board. The solder balls attached at the bottom surface of the IC substrate cannot be precisely placed on the solder pads on a PCB by the use of regular stencils. The difficulties are caused by the limitation of open areas on the PCB due to the fact that the area designated for placement of the reworked IC device is often surrounded with other IC devices (See FIG. 1). There are no additional areas surrounding the designated space required for placing and removing the stencil. Therefore, the apparatus and method disclosed by Swamy et al. do not provide a solution to overcome the difficulties faced by the manufacturers in the process of removing a defective IC package for rework and then placing the repaired IC package back to a PCB.

A commercially available product 'SolderQuik®' made by Raychem Corporation to repair BGA by the use of a holder consisting of a laminate of water soluble polymers and paper that holds solder balls or columns in the desired array pattern. The application of the SolderQuik® can be better understood by referring to FIG. 2, copy of a page from Raychem Corporation's "How SolderQick® Works" for the application the SolderQuik® to a Quad Flat Pack (QFP). A user of the SolderQuik® which holds solder-strips, e.g., or solder balls in the case of a BGA IC package, corresponding to the pads are placed upon the pads and aligning the 'fingers' with respect to the pads. The pretinned component leads are then placed into the tape slots. A reflow process is performed, e.g., a reflow with hot bar as depicted. The solder preform ribbon melts. The downward forces from the SolderQuik® tape fingers, and from the hot bar when used, combined with the surface tension and wicking action of the melting solder, act to divide the solder evenly and prevent a bridging between individual solder joints. The tape is removed and the package is cleaned to complete the soldering process.

Raychem's SolderQuik® provides a convenient way to repair smaller areas of the BGA packages. However, the process requires careful attention to precisely align the balls with each pads for soldering each individual solder ball thereon. The attention and time required for alignment and individual application of solder balls to solder pads still require much time and effort. The rework and repair of BGA package to correct defective connections and soldering do not provide a total solution to the difficulties faced by the industry. Furthermore, the apparatus and processes employed by the conventional techniques, including Raychem's SolderQuik®, are not suitable for development of highly efficient and automated processes for large scale industrial applications.

Therefore, a need still exists in the art of semiconductor manufacturing and packaging to provide an apparatus and method to overcome these difficulties and limitations. Specifically, this apparatus and rework method must be achievable by the use of low cost equipment, easy to use with simple operational procedures and can be conveniently automated for implementation to facilitate high speed mass-production manufacture processes.

SUMMARY OF THE PRESENT INVENTION

It is therefore an object of the present invention to provide an IC package rework apparatus and method by the use of a solder paste inter-layer and alignment apparatus which is simple and flexible to operate and conducive to automation at very low cost whereby the aforementioned difficulties encountered in the prior art can be resolved.

Specifically, it is an object of the present invention to provide an IC package rework apparatus and method by the use of a solder paste inter-layer and alignment apparatus wherein solder paste can be conveniently applied and then aligned with solder pads such that the productivity of package rework can be increased.

Another object of the present invention is to provide an IC package rework apparatus and method by the use of a solder paste inter-layer and alignment apparatus which can be flexibly cut into one or several standard sizes of IC packages such that the package rework can be flexibly performed.

Another object of the present invention is to provide an IC package rework apparatus and method by the use of a solder paste inter-layer and alignment apparatus which allows the placement and alignment of solder balls with solder pads on the package carrier to be precisely performed with high level of accuracy such that the rework yield may be improved.

Another object of the present invention is to provide an IC package rework apparatus and method by the use of a solder paste inter-layer and alignment apparatus wherein the inter-layer can be used as an insulative spacer to prevent bridging effect between solder balls.

Briefly, in a preferred embodiment, the present invention discloses an integrated circuit (IC) package solder paste inter-layer and alignment apparatus for applying and aligning solder paste with a corresponding solder pad on said IC package carrier. The apparatus includes a thin layer which is composed of high-temperature-resistant, non-solder-wetting, and electrical-insulating materials. The apparatus further has a plurality of apertures, each disposed on and penetrating through the thin layer for applying a solder paste therein and for aligning with the corresponding solder pads on the IC package carrier. The apparatus further includes a removable thin film tape disposed on a bottom surface of the thin layer for temporarily maintaining the solder paste in the plurality of apertures.

It is an advantage of the present invention that it provides an IC package rework apparatus and method by the use of a solder paste inter-layer and alignment apparatus wherein solder paste can be conveniently applied and then aligned with solder pads such that the productivity of package rework can be increased.

Another advantage of the present invention is that it provides an IC package rework apparatus and method by the use of a solder paste inter-layer and alignment apparatus which can be flexibly cut into one or several standard sizes of IC packages such that the package rework can be flexibly performed.

Another advantage of the present invention is that it provides an IC package rework apparatus and method by the use of a solder paste inter-layer and alignment apparatus which allows the placement and alignment of solder balls with solder pads on the package carrier to be precisely performed with high level of accuracy such that the rework yield may be improved.

Another advantage of the present invention is that it provides an IC package rework apparatus and method by the use of a solder paste inter-layer and alignment apparatus wherein the inter-layer can be used as an insulative spacer to prevent bridging effect between solder balls.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 1 shows a cross-sectional view of a plurality of IC packages installed on a printed circuit board (PCB) with a rework IC package to be re-installed onto the PCB;

FIG. 3 is a top view of the solder paste inter-layer and alignment apparatus of the present invention;

FIG. 4 shows a side view of a configuration for solder paste application by the use of the solder paste inter-layer and alignment apparatus of the present invention;

FIGS. 5A and 5B show an enlarged side views of the solder paste application by using the apparatus of FIGS. 2 and 3;

DETAILED DESCRIPTION OF THE PREFERRED EMBODIMENT

FIG. 3 shows a top view of a solder paste inter-layer and alignment apparatus 100 of the present invention. This solder paste inter-layer and alignment apparatus 100 is a thin layer formed with a plurality of solder ball apertures 110 corresponding to the solder pads on a BGA package carrier. This thin layer, i.e., the inter-layer and alignment apparatus 100, is composed of high temperature resistant and nonwetting-to-the-solder materials. This inter-layer 100 can be formed as a long strip with a standard size of one IC die as shown wherein this long strip can be flexibly cut for application to rework on one or several IC packages depends on the rework requirements.

Figure 2A:
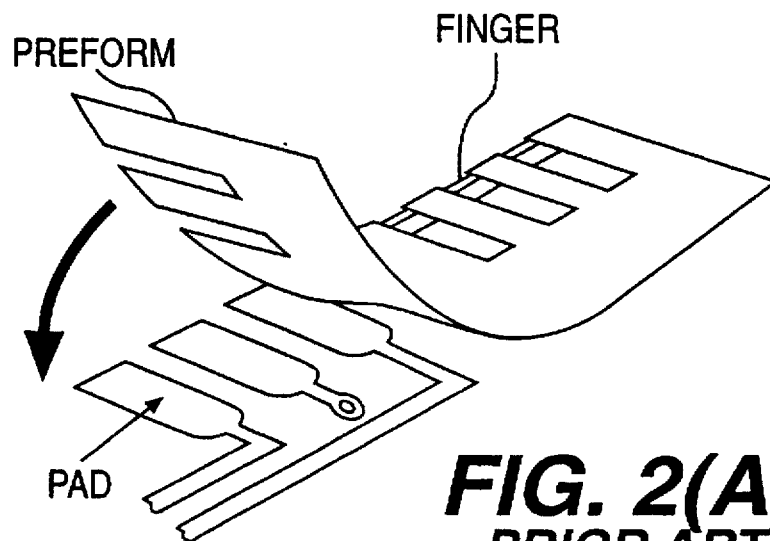
FIG. 2 shows a conventional apparatus and method employed in the prior art for performing a task of IC package rework.
Figure 2B:
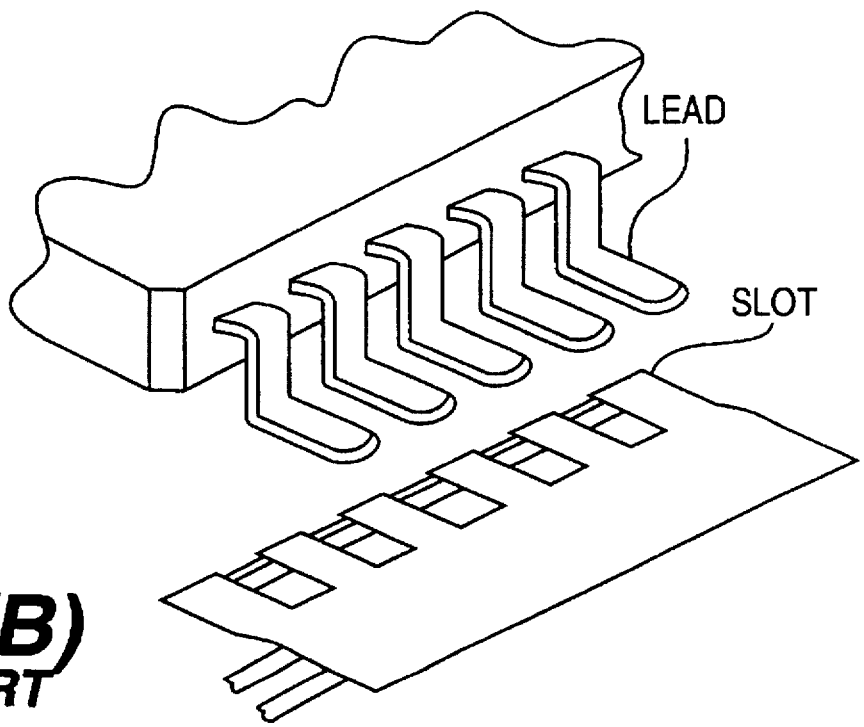
Figure 6:
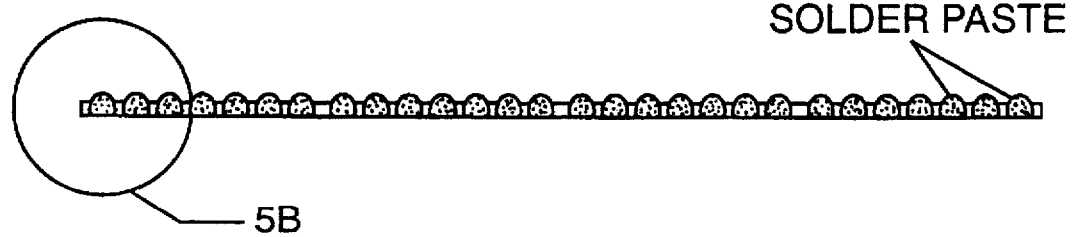
FIG. 6 shows a side view of the solder paste inter-layer and alignment apparatus with application of solder paste thereon.

FIG. 4 shows a side view of the configuration to apply solder paste onto the solder paste inter-layer and alignment apparatus 100 by the use of a stencil 130. The inter-layer 100 includes a tape 120 attached on the bottom surface. FIG. 5A shows an enlarged side view of the relative position of the stencil 130 and the inter-layer 100 for applying the solder paste onto the inter-layer 100. The stencil 130 also includes a plurality of apertures 140 corresponding to the solder pads and the apertures 110 on the inter-layer 100. In order to apply the solder paste, the stencil is first aligned with the inter-layer 100 such that each of the apertures 140 of the stencil 130 is aligned with a corresponding aperture 110 on the inter-layer 100. FIG. 5B shows an enlarged side view of the inter-layer 100 when the solder paste 150 has been applied thereon. The solder paste 150 fills each of the apertures 110 on the inter-layer 100. FIG. 6 shows a side view of the inter-layer 100 with the solder paste 150 applied by the use of the stencil 130. Each aperture 110 is now filled with the solder paste 150.

Figure 7:
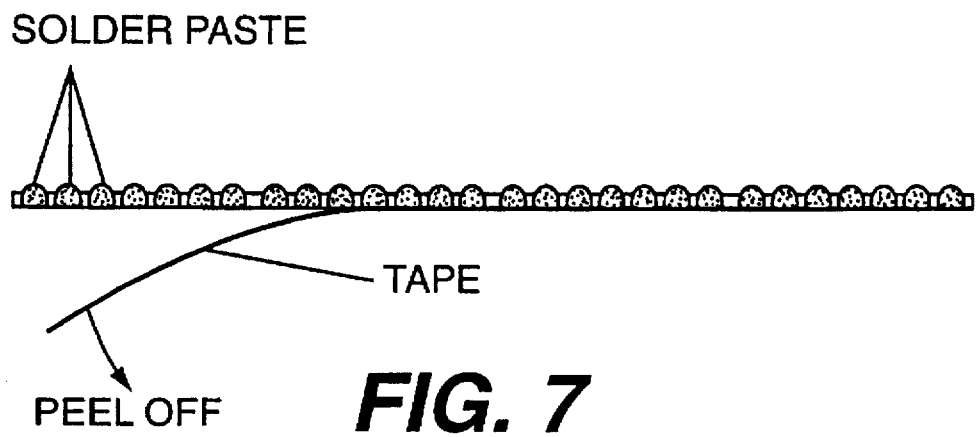
FIG. 7 shows a side view of the solder paste inter-layer and alignment apparatus with application of solder paste thereon and a thin tape layer peeling off from a bottom surface therefrom.

In order to apply this solder paste inter-layer and alignment apparatus 100 to repair a BGA package, the tape 120 which is attached onto the bottom surface of the inter-layer 100 is removed as that shown in FIG. 7. The tape 120 is easily peeled off thus exposing the solder paste 150 filled in each of the solder ball apertures 110 disposed on the inter-layer 100. The inter-layer 100 is now ready to be employed for a rework process to align and then reinstall the solder balls onto the solder pads on the back of a printed circuit board (PCB) or other type of BGA carrier.

Figure 8:
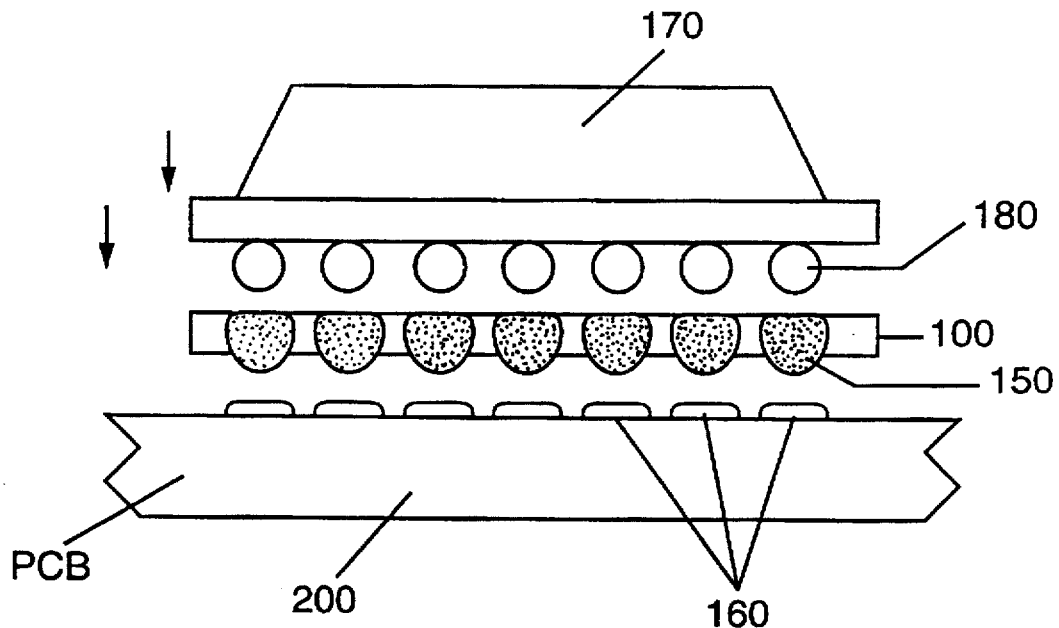
FIG. 8 shows a side view of a configuration for applying the solder paste inter-layer and alignment apparatus for performing an IC package rework.

FIG. 8 shows a configuration by the use of this inter-layer 100 to easily accomplish the task of BGA rework. The inter-layer 100 with the apertures 110 filled with solder paste 150 is placed onto a surface of an IC package carrier 200 with a plurality of solder pads 160 disposed thereon. Various standard alignment procedures can be applied for precisely aligning the apertures 110 with each of the corresponding solder pads 160. A solder ball installation means 170 which may contain BGA molding compound is used to place a plurality of solder balls 180 onto each aperture 110 fled with solder paste 150 therein. Because of the use of the solder paste 150, it is relative easy for the solder balls 180 to remain fixed and attached to the solder paste 150. The rework of the BGA package is completed by performing a reflow process with introduction of hot air to melt and then solidify the solder paste 150 and the solder balls 180 to the solder pads 160.

The inter-layer 100 thus provides a function to conveniently apply the solder paste 150 for precise alignment with the solder pads 160. In the final fellow process, the inter-layer 100 is kept in as part of the BGA package. The inter-layer 100 is composed of high temperature resistant, insulative, and non-wetting-to solder materials which serves also as a spacer to prevent the bridge effects between the solder balls.

Therefore, in a preferred embodiment, the present invention discloses an integrated circuit (IC) package solder paste inter-layer and alignment apparatus 100 for applying and aligning solder paste 150 with a corresponding solder pads 160 on said IC package carrier 200. The apparatus 100 includes a thin layer 100 which is composed of high-temperature-resistant, non-solder-wetting, and electrical-insulating materials. The apparatus further has a plurality of apertures 110, each disposed on and penetrating through the thin layer 100 for applying a solder paste 150 therein and for aligning with the corresponding solder pads 160 on the IC package carrier 200. The apparatus 100 further includes a removable thin film tape 120 disposed on a bottom surface of the thin layer 100 for temporarily maintaining the solder paste 150 in the plurality of apertures 110.

With the application of this solder paste inter-layer and alignment apparatus 100, a simple rework process is available. This rework apparatus provides the dual functions of solder paste application and alignment. Since this inter-layer can be conveniently cut into different standard die sizes and formed with apertures to fit different packaging specifications, the inter-layer apparatus 100 provides a flexible processing tool for applying and aligning solder paste to perform a task of rework and repair the IC packaging. The task of IC package rework can be carried out according the following steps:

1) Aligning the solder paste inter-layer 100 with the stencil 130 such that each aperture 110 on the inter-layer is precisely aligned with a corresponding aperture 140 on the stencil 130.

2) Applying the solder paste 150, such as an eutectic solder paste, through the apertures 140 on the stencil 130 to fill each of the apertures 110 on the inter-layer 100 then remove the stencil 130.

3) Placing the solder ball box 150 underneath the alignment means 140 wherein the base seat should fit right into the top opening of the solder ball box 150.

4) Peeling of the thin film tape 120 from the bottom surface of the inter-layer 100.

5) Aligning the inter-layer 100 with an IC package carrier 200 such that each solder paste 150 is aligned with a corresponding solder pads 160 disposed on the IC package carrier 200, then place the inter-layer 100 onto the surface disposed with the solder pads.

6) Placing a solder balls 180 into each aperture 110 which is now filled with solder paste 150 whereby the solder balls 180 are resting on the solder paste 150 and in electrical contact with the solder pads disposed on the IC package carrier 200.

7) Applying IR reflow or other method of reflow, e.g., convection reflow, to the entire package with the solder balls 180 resting on the solder paste 150 thus completing the package rework process.

As shown in the above processes, the solder paste inter-layer alignment apparatus 100 can be conveniently cut into different standard sizes for flexibly apply for IC package rework with single or multiple chip packages. The inter-layer 100 is composed of high-temperature resistant, electrical insulating and non-solder-wetting materials such as FR4 layer or other type of layers suitable for making printed circuit boards. The inter-layer 100 can be formed with thickness ranging from 0.2 to 0.5 millimeters (mm) depending on the application and IC packages for rework This inter-layer 100 can be thinner than 0.2 mm if the solder balls of the package is even smaller.

For a person of ordinary skill in the art, it can also be readily appreciated that such a solder paste inter-layer for rework and alignment can be used for different packaging processes not limited to the ball grid array (BGA) rework Any IC packaging process which requires the application and alignment of solder paste for making external electrical connections may apply such an inter-layer to conveniently and effective simplify the manufacture or rework processes.

The present invention thus provides an IC package rework apparatus and method by the use of a solder paste inter-layer and alignment apparatus which is simple and flexible to operate and conducive to automation at very low cost such that the difficulties encountered in the prior art are resolved. Specifically, an IC package rework apparatus and method by the use of a solder paste inter-layer and alignment apparatus is provided wherein the solder paste can be conveniently applied and then aligned with solder pads such that the productivity of package rework is increased. Furthermore, the inter-layer can be flexibly cut into one or several standard sizes of IC packages such that the package rework can be flexibly performed. Additionally, the placement and alignment of solder balls with solder pads on the package carrier can be precisely performed with high level of accuracy and the rework yield is improved. Also, the inter-layer can be used as an insulative spacer to prevent bridging effect between solder balls.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. An integrated circuit (IC) package solder paste inter-layer and alignment apparatus for applying and aligning solder paste to each of corresponding solder pads disposed on an IC package carrier, said apparatus comprising:

an inter-layer composed of non-deformable, non-expandable, high-temperature-resistant, non-solder-wetting and electrical-insulating materials;

a plurality of apertures disposed on and penetrating through said inter-layer for applying solder paste therein said apertures corresponding with said solder pads on said IC package carrier; and a removable tape disposed on a bottom surface of said inter-layer for temporarily maintaining said solder paste in said plurality of apertures.

2. The solder paste inter-layer and alignment apparatus of claim 1 wherein:

said removable tape disposed on said bottom surface of said thin inter-layer is removable to expose said solder paste deposited in said plurality of apertures for placement of solder balls on said solder paste in each of said apertures.

3. The solder paste inter-layer and alignment apparatus of claim 2 wherein:

said inter-layer is composed of a material having a high glass transition temperature and being non-solder wetting and electrical insulating.

4. The solder paste inter-layer and alignment apparatus of claim 2 wherein:

each of said apertures on said inter-layer is employed for placing a solder ball therein, and each of said apertures has a diameter slightly greater than that of said solder balls.

5. The solder paste inter-layer and alignment apparatus of claim 4 wherein:

said inter-layer has a thickness smaller than said diameter of said solder balls wherein said inter-layer thickness ranging approximately from 0.1 millimeters to 0.5 millimeters.

6. The solder paste inter-layer and alignment apparatus of claim 5 wherein:

each of said apertures on said inter-layer is disposed with a distance and an arrangement corresponding with said solder pads on said IC package carrier.

7. An integrated circuit (IC) package rework apparatus for reinstalling an IC package to an IC package carrier wherein said IC package carrier includes a plurality of solder pads disposed thereon, said rework apparatus comprising:

a stencil including a plurality of stencil apertures, each corresponding to one of said solder pads;

a solder-paste alignment inter-layer including an inter-layer composed of non-deformable, non-expandable, high-temperature-resistant, non-solder-wetting and electrical-insulating materials;

said solder-paste alignment inter-layer further having a plurality of apertures disposed on and penetrating through said inter-layer;

said stencil being provided for applying solder paste into said plurality of apertures on said inter-layer;

said solder-paste alignment inter-layer being provided for aligning said aperture on said inter-layer with said corresponding solder pads on said IC package carrier; and a removable tape disposed on a bottom surface of said inter-layer for temporarily maintaining said solder paste in said plurality of apertures on said inter-layer.

* * * * *

UNITED STATES PATENT AND TRADEMARK OFFICE
CERTIFICATE OF CORRECTION

PATENT NO.:     5,695,109

DATED:          December 9, 1997

INVENTOR(S):    Ping-Haung CHIANG, Lung-Tai CHEN, and Yu-Kon CHOU

It is certified that an error appears in the above-identified patent and that said Letters Patent is hereby corrected as shown below:

On the Title Page, Item [75], in the Inventors, line 2, "Chutung Hisnchu" should read --Hsinchu--.

On the Title Page, Item [73], in the Assignee, line 2, after "Institute,", insert --Hsinchu,--.

In claim 1, col. 7, line 42, after "therein", insert --,--.

Signed and Sealed this

Twenty-ninth Day of December, 1998

Attest:

BRUCE LEHMAN

*Attesting Officer*                    Commissioner of Patents and Trademarks